United States Patent [19]

Inouye et al.

[11] 4,188,086

[45] Feb. 12, 1980

[54] CONNECTOR FOR TERMINATING FLEXIBLE PARALLEL CONDUCTORS

[75] Inventors: Hiromasa Inouye, Musashino; Tomonari Ohtsuki, Itabashi; Yoshiaki Igarashi, Ichikawa, all of Japan

[73] Assignee: Bunker Ramo Corporation, Oak Brook, Ill.

[21] Appl. No.: 914,196

[22] Filed: Jun. 12, 1978

[30] Foreign Application Priority Data

Jun. 13, 1977 [JP] Japan .......................... 52/075911[U]

[51] Int. Cl.[2] ........................ H01R 13/54; H05K 1/12

[52] U.S. Cl. ........................... 339/176 MF; 339/17 F

[58] Field of Search ................ 339/17 R, 17 F, 75 M, 339/75 MP, 91 R, 196 MF

[56] References Cited

U.S. PATENT DOCUMENTS 3,154,365 10/1964 Crimmins ........................ 339/17 F X 3,753,207 8/1973 Maheux et al. .......... 339/176 MF X 3,897,130 7/1975 Donnelly et al. .............. 339/17 F X 3,950,067 4/1976 Leavesley ....................... 339/17 F X

*Primary Examiner*—Eugene F. Desmond

*Attorney, Agent, or Firm*—F. M. Arbuckle; J. Hoffman

[57] ABSTRACT

An improved connector for terminating flexible parallel conductors in which a male part has a length of distal surface about which an end of a flexible group of parallel conductors is bent. The male part, with the group of parallel conductors bent thereabout is inserted into a female part having a closed slot therein and a plurality of contacts along one of the walls thereof. Upon mating of the two connector parts, the contacts of the female part electrically engages respective ones of the parallel conductors. Various means are provided for keeping the conductors aligned during the mating action and latch members on both male and female parts cooperate to releasably secure the two parts together.

4 Claims, 14 Drawing Figures

Fig. 1A
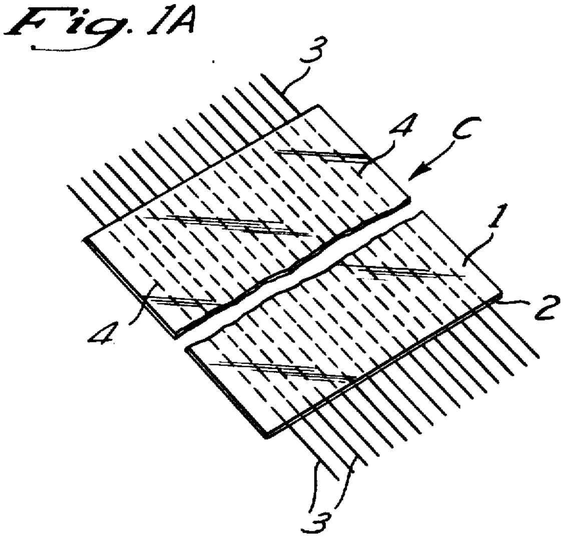
Fig. 1B
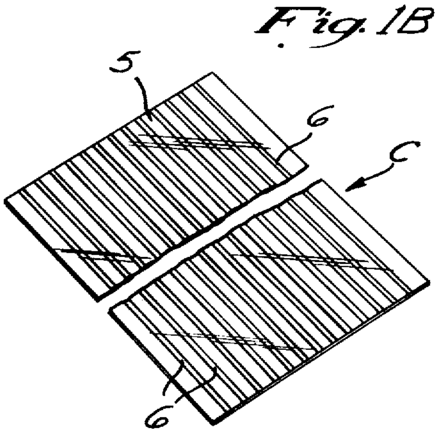
Fig. 2A
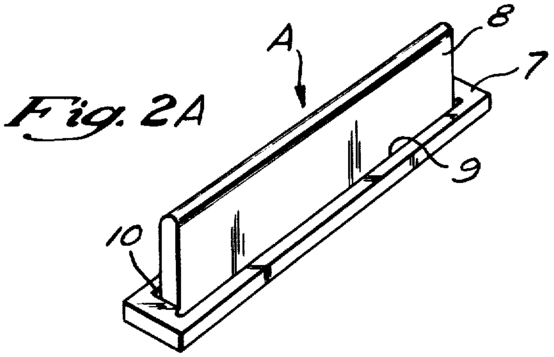
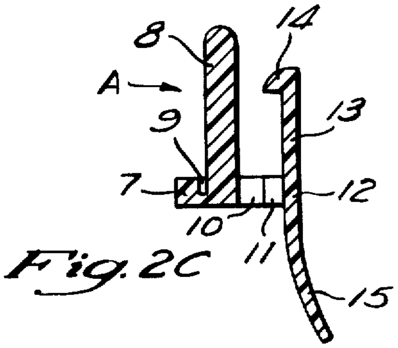
Fig. 2C
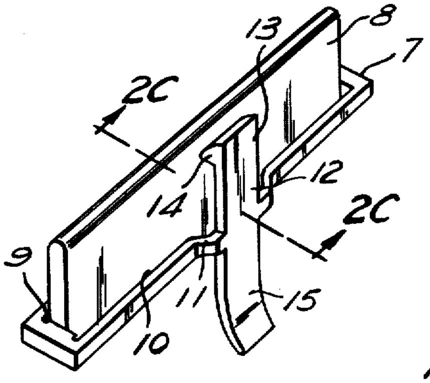
Fig. 2B
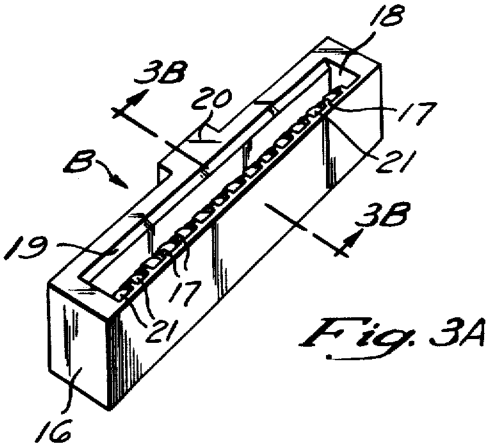
Fig. 3A
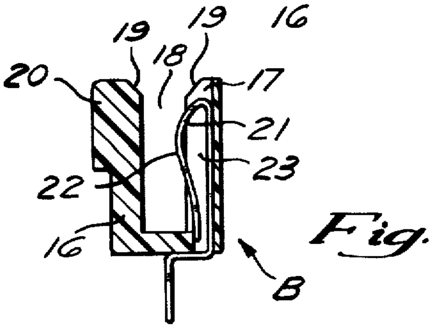
Fig. 3B Fig. 4
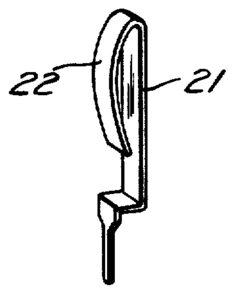
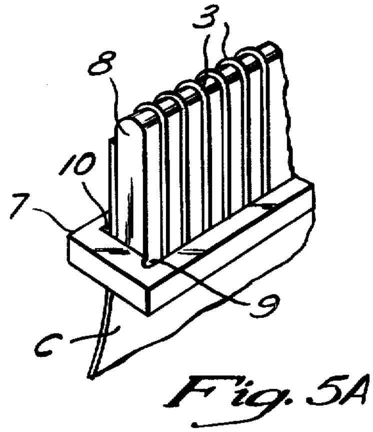
Fig. 5A
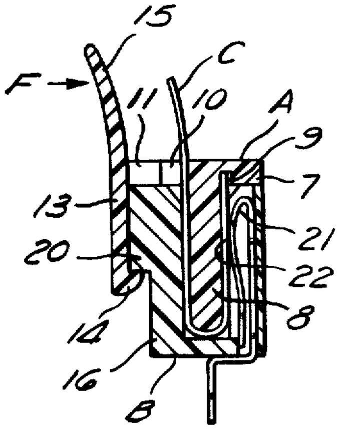
Fig. 5B
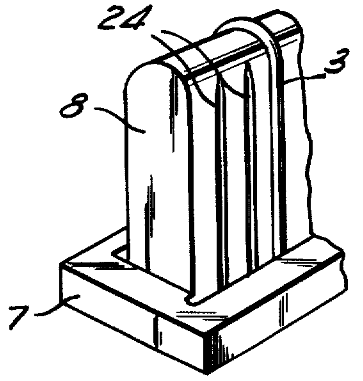
Fig. 6
Fig. 7
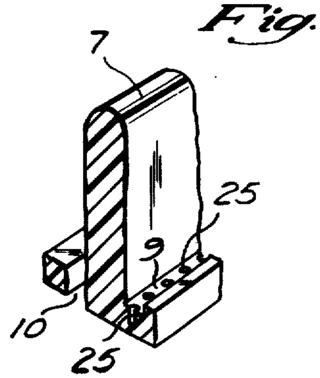
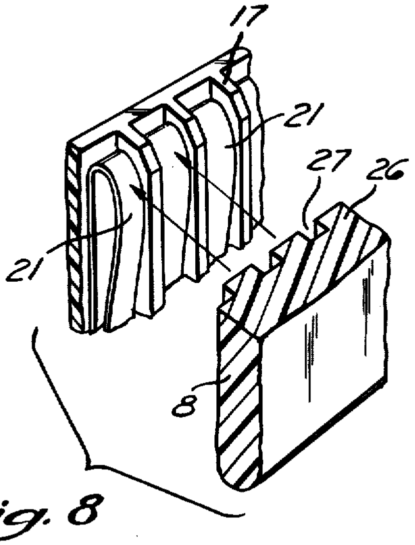
Fig. 8
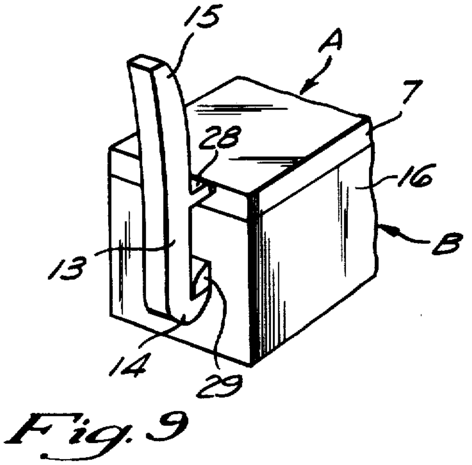
Fig. 9

CONNECTOR FOR TERMINATING FLEXIBLE PARALLEL CONDUCTORS

TECHNICAL FIELD

This invention relates to connectors for terminating flexible parallel conductors, and more particularly relates to a connector for terminating a flexible web of parallel wires or the parallel conductors of a thin flexible printed circuit board.

BACKGROUND OF PRIOR ART

In manufacturing small-size electronic components, it is often necessary to make connection between different modules of electronic parts making up a completed device. In view of the large number of electrical connections generally required, the industry has made such connections between modules with a flexible flat multiconductor cable, commonly called ribbon wire, or with a flexible flat printed circuit board having parallel conductors in the form of thin paths of copper on a flexible substrate.

A common prior art method of attaching the conductors of a ribbon wire to a standard printed circuit board consists in the steps of inserting the conductors of the ribbon wire into their assigned holes, and soldering the wire ends either by hand or by dipping the board and wire ends into a solder tank. In pratice, this rather conventional method of connecting wires to a printed circuit board presents extreme difficulties when attempting to use such a method for ribbon wire. In particular, it is extremely difficult to ensure that all of the conductors are properly seated in their respective holes in the printed circuit board during the soldering operation. Since the ribbon wire is very lightweight and very flexible, an operator has difficulty in maintaining accurate holding forces on the cable, and an occasional wire is left unsoldered without the operator's knowledge.

Since the soldering operation of the ribbon wire onto a circuit board is done by the assembly line method, and since the flexible ribbon wire is light in weight and often very short, after the printed circuit board is conveyed to the circuit tank and the conductors of one end of the ribbon wire are inserted into the holes of the board and all of the wires have been properly seated, a proper soldering procedure can, with difficulty, be accomplished. However, in order to connect the other end of the ribbon wire to another printed circuit board by the solder tank method, the printed circuit board having the conductors of the ribbon wire already connected to the board has to be properly positioned so as to prevent the already connected terminals from becoming unsoldered and allowing the ribbon wire to slip out of the holes while being conveyed into the solder tank. In order to ensure then that one end of the ribbon wire will not come loose when the other end is being soldered, the conveyor equipment for the automatic solder tank operation must be more complicated in its structure leading to either prohibitive expense or impracticability. For this reason, manufacturers have resorted to individual soldering by hand as the conventional method for attaching ribbon wires to printed circuit boards. This procedure is, of course, cumbersome, time consuming and costly.

In order to avoid the problems associated with solder tank techniques, an attempt has been made to eliminate the need for soldering by affixing the female part of a connector onto a printed circuit board and making connection to the points on the printed circuit board that require connection to another location in the apparatus. Attempts were then made to insert and thus connect the ends of a ribbon wire or flexible printed circuit board to the contacts of the female connector. However, due to the thin and flexible nature of the ribbon wire or flexible printed circuit board strips, reliable connection to the female connector has proven to be impossible. Additional attempts have been made to lower the contacting pressure of the female contact in order to permit insertion of the ribbon wire or flexible printed circuit board, but this has led to additional problems. Added to the low reliability of contact, any small outside force can interrupt such a connection easily, or vibrating the apparatus may cause temporary disconnection, etc.

BRIEF SUMMARY OF INVENTION

It is therefore an object of the present invention to provide an improved connector for receiving the conductors of a ribbon wire or flexible printed circuit board, in which a firm and positive electrical contact is made between each of the conductors and its respective contact.

In accordance with the invention, a connector for terminating flexible parallel conductors comprises a male part and a female part. The male part has an extended length of distal surface about which an end of the flexible parallel conductors is bent. The male part, with the end of the group of parallel conductors bent thereabout, is then inserted into a closed slot in the female part of the connector. The female part has a plurality of contacts along at least one wall of the slot therein, the contacts making electrical connection with respective ones of the parallel conductors upon seating of the male part into the slot of the female part.

In a preferred embodiment, the male part comprises a rectangular base portion and an elongate projection projecting perpendicularly from the base portion, the end of the elongate projection defining the aforementioned length of distal surface.

In order to secure the two parts of the connector together, an extended locking arm projects from the base portion of the male part and has a hook on its end for locking engagement with an engagement means in the form of a protrusion on an external surface of the female part. When these two parts are mated together, the hook engages the protrusion to securely latch the two parts together. For release of the latch, a tab is provided, substantially continuous with the hooked locking member and extending in the opposite direction thereto, the tab having an outwardly curving free end which when forced in a direction toward the connector moves the hook arm away from the connector and releases the hook from the protrusion.

The base portion may be generally rectangular in shape, and a thin ridge spaced from and running parallel to one of the long edges of the rectangular base may be formed integrally with the locking arm and release tab, whereby the ridge is subject to twisting upon movement of the hooked arm away from the elongate projection of the male part when the release tab is pushed. Alternatively, the locking arm and release tab may be in the form of a continuous piece which is connected to the side edges of the male part by a thin flexible link.

In the preferred embodiment, the male projection is in the form of a flat plate with a rounded distal surface, the plate having a pair of parallel planar surfaces leading from the base to the distal surface. An elongated opening is provided in the base portion adjacent one of the planar surfaces of the male projection for receiving the flexible parallel conductors and keeping the conductors aligned relative to the contacts in the female part.

On the opposite side of the male projection from the elongated opening, a groove is provided in the base portion along the length of the male projection. The groove is provided for receiving the tips of the parallel conductors and holding them in place while the male part of the connector is inserted into the female part. In one embodiment of the invention, a plurality of spaced recesses is provided in the base of the groove for receiving and holding the tips of the conductors. The recesses therefore serve to space the conductors as well as hold their tips in place during assembly of the connector.

Another preferred feature of the invention consists in the provision of a series of shallow grooves provided in the male projection in at least one surface thereof and directed perpendicular to the base portion, for receiving the respective conductors of a flexible group of parallel conductors, the shallow grooves serving to maintain preferred conductor spacing during the insertion process.

For further reliability in the alignment of conductors within the connector, one wall of the closed slot in the female portion may be provided with short partitions extending toward the center of the connector, separating and insulating adjacent contacts from one another. One surface of the male projection may be provided with protruding ridges positioned to be received between the partitions when the male and female parts are mated.

For ease of connecting the male and female parts together, the distal surface of the male projection may be rounded, and the upper interior wall surfaces of the slot in the female part may be chamfered. This not only positions the two parts relative to one another before full insertion, but ensures minimum movement of the parallel conductors away from their preferred aligned positions.

BRIEF DESCRIPTION OF DRAWINGS

The invention will now be described in detail with reference to the accompanying drawings representing preferred embodiments of the connector according to the present invention. In the drawings:

FIGS. 1A and 1B show respectively, perspective views of a ribbon wire and flexible printed circuit board having parallel conductors for which the connector of the present invention serves to terminate.

FIGS. 2A and 2B show front and rear perspective views, respectively, of the male part of the connector according to the invention.

FIG. 2C shows a cross-section of the male part taken along the lines 2C—2C of FIG. 2B.

FIG. 3A shows a front perspective view of the female part of the connector according to the present invention.

FIG. 3B shows a cross-sectional view of the female part of FIG. 3A taken along the lines 3B—3B.

FIG. 4 is a perspective view of a contact member for the female part of the connector.

FIG. 5A is a partial perspective front view of the male part, showing the conductors of a ribbon wire bent around the elongate projection thereof.

FIG. 5B is a vertical cross-sectional view of a mated pair of male and female connector parts with a ribbon wire in terminated position.

FIG. 6 is a partial perspective view of a male part showing shallow grooves in the elongate projection thereof.

FIG. 7 shows a partial perspective view of the male part indicating the location of holes for receiving the tips of the conductors of a ribbon wire.

FIG. 8 shows a partial perspective view of female and male connector parts, wherein partitions in the female part align with channels between protruding ridges on the male part.

FIG. 9 shows a partial perspective view of one end of a mated pair of male and female connector parts in which a latch member is shown attached to an end of the pair of mated connector parts.

DETAILED DESCRIPTION OF INVENTION

The connector according to the present invention is used to provide connection of a thin flexible web or film of parallel conductors. FIG. 1A shows a type of flexible flat cable, often referred to as a ribbon wire, in which a plurality of parallel soft copper wires 4 are sandwiched between films 1 and 2 to produce a ribbon wire with exposed conductors 3 at each end. Such ribbon wire can also be produced in a continuous length and cut and stripped in a conventional manner.

FIG. 1B shows a strip of flexible printed circuit board material 5 with a plurality of copper plated conductor paths 6. In the following detailed description of the invention, reference will be made to utilizing the connector for terminating the type of multi-conductor cable shown in FIG. 1A, although it is to be understood that any form of flat flexible parallel conductor strips can be advantageously terminated by the connector.

In FIG. 2A, the male part A of the connector is shown to consist of a base portion 7 and an elongate projection 8. The elongate projection 8 is arranged perpendicularly to the substantially rectangular base portion 7, and the length of the elongate projection 8 is selected so that it will correspond to the width of the ribbon wire to be terminated. An elongated groove 9 is provided in the front side of the male part for the purpose of retaining the tips of the bared wires 3 of the ribbon wire strip, and the length of the elongated groove 9 is selected so that it will accommodate all of the wire tips along the width of the ribbon wire strip. In order that the tip of the ribbon wire will lie flat against one side surface of the elongate projection 8, the groove 9 has its interior wall coincident with the respective side surface of elongate projection 8.

The base portion 7 is provided, on the rear side of the elongate projection with an elongated opening defining a passageway for receiving the ribbon wire. The length of the elongated opening 10 is chosen to be slightly longer than the width of the ribbon wire in order that it would not present an obstacle to the insertion of the ribbon wire. Additionally, the opening 10 has a width slightly larger than the width of the ribbon wire, and the length and width dimensions of the opening 10 thus prevent the ribbon wire from moving while handling the male part A. Further, in order that the ribbon wire will lie flat against the rear side of elongate projection 8, the interior wall of opening 10 is coextensive with the rear wall of elongate projection 8.

As best viewed in FIG. 2B, the opening 10 leaves a thin strip 11 of the material of the base portion to span across the two ends of the male part A. The strip 11, in addition to holding the ribbon wire in place as discussed above, serves also to provide a support for a locking member 13 which may be formed integral with an outwardly deformed segment 12 of strip 11. The amount of outward deformation of strip 11 to form segment 12 is such that the inside surface of locking member 13 will lie against the outer surface of the female connector part to be discussed later.

The locking member 13 is in the form of an extended arm having a hook at its end. A release tab 15 is formed substantially co-planar with the locking member 13 and has an outwardly curved tip for ease of releasing the hook 14 from a cooperating engagement means on the female part B.

FIG. 2C shows, in cross-section, the relative depth of the groove 9, the extent of outward deformation of segment 12, the width of the opening 10, and the shapes of the locking member 13 and elongate projection 8. As can be appreciated by reference to FIG. 2C, all of the elements making up the male part A can be formed in a single monolithic body of synthetic material, such as plastic.

The female part B of the connector is shown in FIGS. 3A and 3B, the female part A having a box-shaped body 16 with, in a preferred embodiment, a plurality of partitions 17 aligned along one wall of closed slot 18. The elongate projection 8 of the male part is received in closed slot 18, and bevelled edges 19 serve to smoothly guide the projection 8 into slot 18. A plurality of contacts 21 are arranged along one wall of the slot 18, and in FIG. 3 the contacts 21 are fitted between the partitions 17. An engagement means for the locking member 13 is shown as a protruded element 20 with which the hook 14 can be latched. The space 23 between partitions 17 permit accurate alignment of the individual contacts 21 and simultaneous preferred placement of the contacting portion 22 of each contact within the closed slot 18.

FIG. 4 shows in detail the style of contact used in the female part.

As shown in FIG. 5A, the bare wires 3 at the terminal end of the ribbon wire C are first inserted into the retaining groove 9 of the male part A, the ribbon wire is then bent along the contour of the elongate projection 8, and the cable C is then inserted through elongated opening 10. Alternatively, the ribbon wire C could be first inserted through opening 10, and the ends then bent about the distal portion of projection 8 to a length sufficient to seat the tips of the wires 3 in groove 9. Next, the elongate projection 8 of the male part is inserted into the slot 18 of the female part B so that the wires 3 of the ribbon wire strip C are positioned in contact with the contacting portion 22 of contacts 21. The mated connector parts, with the ribbon wire sandwiched therebetween, is best seen in FIG. 5B, showing a cross-sectional view of the completed assembly.

FIG. 5B also shows the engagement of hook 14 with the protruded element 20. When it is desired that the two connector parts be released, a force is applied in the direction of arrow F against tab 15 which twists the thin strip 11 to oppose the natural biasing force due to the molding of strip 11 integral with that of the locking member 13 and base portion 7. When the release tab 15 is pushed in the direction of arrow F, the strip 11 is caused to twist, the hook 14 becomes disengaged from protruded element 20, and the two parts may be separated.

In the assembled condition shown in FIG. 5B, since the ribbon wire is inserted into the female part B with the projection 8 as a guide, an interference fit secures the ribbon wire in place, despite the soft flexible nature of the ribbon wire.

In the foregoing, one preferred embodiment of the invention was explained. FIGS. 6–9 show certain improvements which can be advantageously applied.

In particular, FIG. 6 shows a plurality of shallow grooves 24 formed on at least one surface of the projection 8 for the purpose of more accurately aligning each wire 3, as examplified in the figure. The grooves 24 serve to maintain a prescribed distance between wires, the distance corresponding to the distance between contacts in the female part B.

In FIG. 7, a plurality of holes are shown at the base of the groove 9 into which the tips of the wires of the ribbon wire strip can be inserted, and these holes may be used independent of or in conjunction with the shallow grooves 24 (FIG. 6) for proper alignment and spacing of the wires 3.

The partitions 17 are best shown in FIG. 8, and this figure also shows a plurality of spaced protruding ridges 26 positioned to be received between respective partitions 17 when the male and female parts are mated. In the mated position, channels 27 between protruding ridges 26 receive the partitions 17. This arrangement further aids in maintaining proper alignment of the wires 3 on the surface of the protruding ridges and between respective partitions 17. In the FIG. 8 embodiment, it is desirable that the shallow grooves 24 (of FIG. 6) are used in conjunction with the protruding ridges 26.

FIG. 9 shows an alternate placement of the locking member and engagement means, the locking member being situated on one or both short ends of the male part A, while the protruded element is located on one or both short ends of the female part B. In FIG. 9, the locking member 13 is shown flexibly connected to base portion 7 by means of a thin flexible link 28, and the protruded element upon which the hook 14 engages is shown at 29.

From the foregoing, it can be readily realized that this invention can assume various embodiments. Thus, it is to be understood that the invention is not limited to the specific embodiments described herein, but is to be limited only by the appended claims.

We claim:

1. A connector for terminating flexible parallel conductors, comprising:

- a male part having a length of distal surface about which an end of a flexible group of parallel conductors is bent, said male part including a base portion and an elongate projection projecting perpendicularly from said base, the end of said elongate projection defining said length of distal surface;
- a female part having a closed slot therein and a plurality of contacts along at least one wall of said slot, for receiving at least said length of distal surface with said end of said group of parallel conductors bent thereabout, said contacts electrically contacting respective ones of said parallel conductors; and
- a plurality of recesses in said base portion of said male part spaced along said elongate projection for receiving and holding the ends of respective ones of said parallel conductors.

2. The connector as defined in claim 1, wherein said base portion of said male part has an elongated groove therein extending along said elongate projection, and wherein said recesses are disposed in said groove.

3. The connector as claimed in claim 1 wherein said base portion of said male part has an elongated opening therein extending along said elongate projection on the side thereof opposite said recesses.

4. A connector for terminating flexible parallel conductors, comprising:

a male part having a length of distal surface about which an end of a flexible group of parallel conductors is bent, said male part including a base portion and an elongate projection projecting perpendicularly from said base, the end of said elongate projection defining said length of distal surface;

a female part having a closed slot therein and a plurality of contacts along at least one wall of said slot, for receiving at least said length of distal surface with said end of said group of parallel conductors bent thereabout, said contacts electrically contacting respective ones of said parallel conductors;

at least one wall of said slot having a plurality of partitions extending therefrom separating and insulating adjacent contacts from one another;

and at least one surface of said projection having spaced protruding ridges positioned to be received between said partitions when said male and female parts are mated.

* * * * *